United States Patent
Daniels et al.

(10) Patent No.: US 6,201,186 B1
(45) Date of Patent: Mar. 13, 2001

(54) ELECTRONIC COMPONENT ASSEMBLY AND METHOD OF MAKING THE SAME

(75) Inventors: Dwight L. Daniels, Mesa; Jeffrey A. Miks, Chandler; Dilip Patel, Mesa, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/106,552

(22) Filed: Jun. 29, 1998

(51) Int. Cl.7 .................................................. H01L 23/28
(52) U.S. Cl. .................. 174/52.4; 257/692; 257/734; 257/787; 361/772; 361/813
(58) Field of Search ................... 174/52.4, 52.2; 361/728, 730, 772, 780, 813; 257/692, 693, 734, 787, 778

(56) References Cited

U.S. PATENT DOCUMENTS

| | | | |
|---|---|---|---|
| 3,716,761 | 2/1973 | Rotast | 317/101 B |
| 3,902,148 | 8/1975 | Drees et al. | 357/70 |
| 4,466,183 | 8/1984 | Burns | 29/827 |
| 4,489,365 | 12/1984 | Daberkoe | 361/403 |
| 4,578,697 | 3/1986 | Takemae | 357/75 |
| 4,595,945 | 6/1986 | Graver | 357/70 |
| 4,612,564 | 9/1986 | Moyer | 357/70 |
| 4,680,613 | 7/1987 | Daniels et al. | 357/72 |
| 4,711,700 | * 12/1987 | Cusack | 156/651 |
| 4,870,356 | 9/1989 | Tingley | 324/158 F |
| 4,924,291 | 5/1990 | Lesk et al. | 357/70 |
| 5,245,214 | * 9/1993 | Simpson | 257/666 |
| 5,378,656 | 1/1995 | Kajihara et al. | 437/217 |
| 5,437,915 | * 8/1995 | Nishimura et al. | 428/209 |
| 5,596,225 | * 1/1997 | Mathew et al. | 257/667 |
| 5,796,159 | 8/1998 | Kierse | 257/668 |
| 5,939,781 | * 8/1999 | Lacap | 257/698 |

* cited by examiner

Primary Examiner—Kristine Kincaid
Assistant Examiner—W. David Walkenhorst
(74) Attorney, Agent, or Firm—Anthony M. Martinez

(57) ABSTRACT

An electronic component assembly (10) is formed by mounting an electronic component (15) to the leads (12) of a leadframe (18). The portions of the leadframe (18) that come in physical contact with the electronic component (15) are electrically connected to the electronic component with bonding wires (31) or by placing the bonding regions (30) of the electronic component (15) in direct physical contact with the tips (35) of the leads (12). A package (20) is used to encapsulate the leads (12) and the electronic component (15).

15 Claims, 3 Drawing Sheets

ELECTRONIC COMPONENT ASSEMBLY AND METHOD OF MAKING THE SAME

BACKGROUND OF THE INVENTION

This invention relates, in general, to electronic components, and more particularly to methods for attaching an electronic component to a leadframe.

Conventional electronic components are assembled by mounting the electronic component to a leadframe and encapsulating the electronic component with a packaging material. The leadframe typically has a die flag, leads, shorting bars and dambars. The die flag is a large central portion of the leadframe to which the electronic component is mounted. Bonding wires are then used to connect the electronic component to the leads as the dambars hold the leadframe together during the assembly process until the packaging material is placed onto the leadframe.

In high volume manufacturing operations, there are at least two problems that result from the use of conventional lead frames that have die flags. First, each electronic component typically has a different size, and thus, requires a specially tailored leadframe that has a die flag that has the proper dimensions. Even if the leadframe is formed with a stamping process, customizing the leadframe to the size of each particular electronic component increases the manufacturing cost of the electronic component.

Secondly, if a manufacturing facility is assembling different electronic components, each requiring a different leadframe, then the overall manufacturing process is made more complicated. Accurate inventorying of the various leadframes and scheduling is required so that the manufacturing facility can efficiently produce the mix of electronic components to meet the constantly changing customer demands.

By now it should be appreciated that it would be advantageous to provide a method of assembling electronic components that obviates the need to use a customized leadframe for each electronic component. Such a process would be less expensive and allow a manufacturing operation to perform more efficiently.

Figure 1:
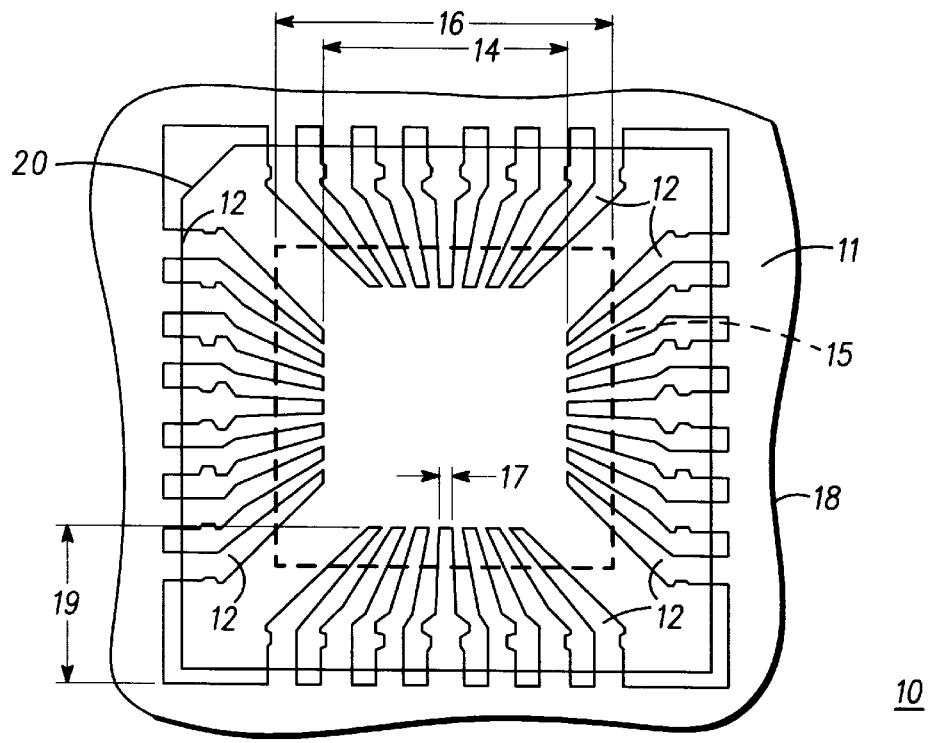
FIGS. 1–2 are top views of electronic component assemblies formed in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

In general, the present invention provides a novel process for assembling electronic components by mounting the electronic component to a leadframe without the use or need of a die flag. The electronic component is mounted directly onto the leads of the leadframe and wire bonds are thereafter used to electrically connect the electronic component to the leads. Because a die flag is not required, it is possible to mount electronic components of different sizes onto the same leadframe. Thus, the same leadframe can be used to assemble electronic components of different sizes. Since it is not necessary to electrically connect every lead to the electronic component, it is also possible to use the same leadframe to assemble electronic components that have fewer output pads than the number of leads on the leadframe.

Turning now to FIG. 1, a more detailed description of the present invention is provided. FIG. 1 is a top view of an electronic component assembly 10 that includes a leadframe 18, an electronic component 15, and a package 20. Leadframe 18 has an outer ring 11 that serves to support a plurality of leads 12 during the manufacture of electronic component assembly 10. Other support structures such as tie bars or dambars may also be optionally used. As will be explained in more detail below, outer ring 11 is a temporary structure that is intended to be removed once package 20 is formed over leadframe 18.

Leadframe 18 can be formed using a variety of techniques known in the art. For example, a stamping process could be used to form leads 12 and outer ring 11 from a single sheet of material. Leadframe 18 could also be formed using a conventional etch technique that involves forming a masking layer over a sheet of material and chemically etching the material exposed by the masking layer, thereby forming the leadframe 18 with the desired pattern. Etching processes typically allow leads 12 to be formed with smaller dimensions, whereas a stamping process is typically less expensive. It is significant to note that leadframe 18, formed in accordance with the preferred embodiment of the present invention, is devoid of a die flag and tie bars. This can reduce the amount of material that is needed to form leadframe 18, and thus, reduce the cost of manufacturing electronic component assembly 10.

Leadframe 18 can be formed so that both the size and number of leads 12 can vary. As shown in FIG. 1, leadframe 18 has twenty-eight leads 12. However, this should not be considered a limitation of the present invention. It is possible to form an electronic component assembly that has as few as two or three leads, and the maximum number of leads is only limited by the capability of the process that is used to form leadframe 18. Current leadframe manufacturing processes can provide leadframe 18 with as many as sixty-four, one-hundred and sixty, or even five-hundred and twelve leads. Both the length (indicated in FIG. 1 with a line 19) and the width (indicated in FIG. 1 with a line 17) of each lead 12 are determined by the requirements of the assembly process and the method used to form leadframe 18. Typically, leads 12 have a length ranging from about 1 millimeter (mm) to 50 mm, and a width ranging from about 0.1 mm to 10 mm. If leadframe 18 is in a sixteen lead configuration, the length of leads 12 is preferably about 5 mm to 10 mm and their width is about 0.5 mm to 1 mm.

Preferably, leadframe 18 is made from a copper alloy, but other materials such as gold, zinc, alloys comprising iron, nickel, or the like could also be used. In addition, it may be desirable to plate portions of leadframe 18 with other conductive materials such as silver or gold to improve the ability to form an electrical connection between electronic component 15 and leads 12.

Electronic component 15 could be one a variety of discrete devices, sensing devices, semiconductor devices, or any other component used in the electronics industry. For example, electronic component 15 can be a discrete component (such as a thyristor, diode, etc.), a semiconductor device (such as a transistor), an integrated circuit (such as a microprocessor, a microcontroller, imaging sensor, a memory device, etc.) or a sensing device (such as an accelerometer, a pressure sensor, a chemical sensor, etc.).

Electronic component 15 is shown in FIG. 1 with dashed lines to represent its relative location on leadframe 18 and so that the underlying leads 12 can be shown. In the preferred embodiment, electronic component 15 is mounted to leadframe 18 so that all of leads 12 are in physical contact with electronic component 15. This is so that the amount of support that leadframe 18 provides to electronic component 15 through leads 12 is maximized. Conventional bonding techniques that use solder material, adhesives, or the like can be used to attach electronic component 15 to leads 12. Preferably, leads 12 are the only portions of leadframe 18 that are in physical contact with electronic component 15.

Once electronic component 15 is mounted to leads 12, bonding wires (not shown) are used to electrically connect electronic component 15 to the desired leads 12. Again, if electronic component 15 were to have fewer than 28 bonding pads, some of leads 12 may be unused and not be electrically coupled to electronic component 15.

Thereafter, package 20 is formed on leadframe 18 using an over-molding, transfer molding, compression molding, or similar molding process. Package 20 could also be a preformed body component that is mounted or bonded to leadframe 18. Package 20 is formed so that it encapsulates at least a portion of electronic component 15 and leads 12. Outer ring 11 of leadframe 18 is then removed so that at least a portion of each of leads 12 extends from package 20 and so that leads 12 are electrically isolated from each other. In other words, each of leads 12 is only electrically connected to electronic component 15 through bonding wires. Thus, if a bonding wire is formed between each of leads 12 and electronic component 15, then every potion of leadframe 18 that is in physical contact with electronic component 15 is also electrically coupled to electronic component 15. Conversely, there is no portion of leadframe 18 (such as a die flag or tie bar) that is in physical contact with electronic component 15 and electrically isolated from electronic component 15.

As shown in FIG. 1, leads 12 are optionally formed so as to leave a central portion of leadframe 18 open. The width of this opening is indicated with a line 14. Electronic component 15 is shown to have a square configuration that has a width indicated with a line 16. Preferably, the width (line 16) of electronic component 15 is at least ten percent wider than the width (line 14) of any central opening so that electronic component 15 is adequately supported during the manufacture of electronic component assembly 10. For example, electronic component 15 should overlap each of leads 12 by at least 100 micrometers ($\mu$m). However, it should be understood that electronic component 15 could be smaller, or have a rectangular configuration so that only a few of leads 12 provide physical support to electronic component 15. Thus, the leadframe of the present invention can be used to assemble various electronic components that are each of a different size or that have a different pin requirement. This obviates the need to form a different leadframe for differently shaped electronic components.

Figure 2:
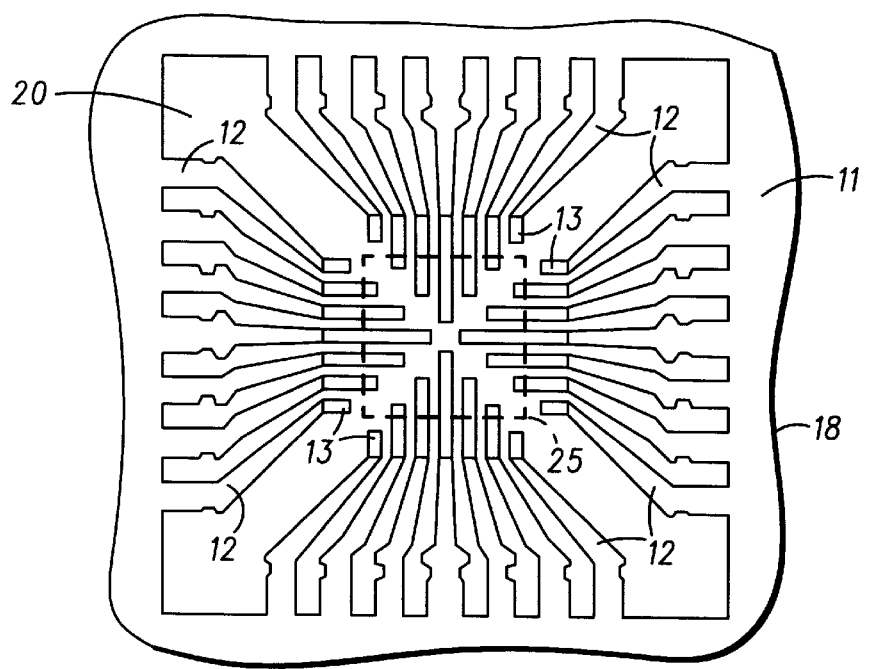

Referring now to FIG. 2, an alternative embodiment of the present invention is provided. To allow leadframe 18 to be used to assemble an electronic component 25 that is smaller than the central opening shown in FIG. 1, it is possible to form lead extensions 13 onto leads 12. For example, a second leadframe (not shown) that has lead extensions 13 is bonded to leadframe 18. Lead extensions 13 are individually attached to a lead 12 to fill in the central portion of leadframe 18. Thus, different materials are connected together to provide an electrical path to electronic component 25. Bonding wires (not shown) are then formed from electronic component 25 to either of leads 12 or lead extensions 13 so that the portion of leads 12 that extend from package 20 are still electrically connected to electronic component 25. FIG. 2 also illustrates that it is not necessary that electronic component 15 be in physical contact with any of leads 12 as it can be supported by less than all of lead extensions 13. It should be understood it is not necessary that each of leads 12 have an extension 13 as it is possible to form extensions 13 on only a subset of leads 12 or form leads 12 to have the configuration shown in FIG. 2.

Figure 3:
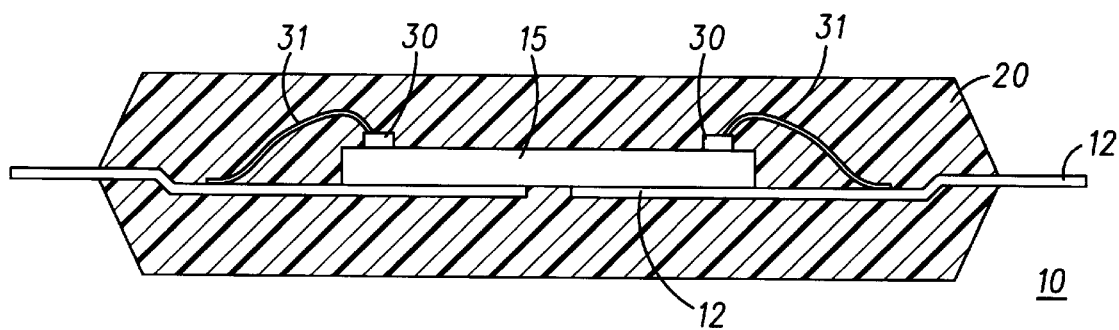
FIGS. 3–5 are cross-sectional views of electronic component assemblies in accordance with various embodiments of the present invention.

FIG. 3 is provided to illustrate how electronic component 15 (see FIG. 1) can be electrically connected to the leads 12 of leadframe 18 (see FIG. 1). As shown, electronic component 15 includes bonding pads or regions 30 that are formed on the upper surface of electronic component 15. Bonding regions represent the electrically active portions of electronic component 15 that are to be electrically connected to leads 12. Bonding wires 31 provide electrical connection between the bonding regions 30 of electronic component 15 and leads 12. For example, one of leads 12 can be used to provide a power supply voltage (e.g., Vdd) to electronic component 15, a second lead 12 can provide a power supply voltage (e.g., ground) to electronic component 15, and a third lead 12 can provide a data signal to electronic component 15 (note only two leads 12 are shown in FIG. 3). Alternatively, each of the three leads 12 could provide a different data signal to electronic component 15. Clearly, in either example it would be necessary for each of the three leads 12 to be electrically isolated from each other.

As mentioned earlier, it may be desirable to plate at least a portion of leads 12 with silver or other material, and then form wire bonds 31 so they are connected to the portion of leads 12 that is plated with silver. In addition, it may be desirable to form an insulating material along the portion of electronic component 15 that comes in physical contact with leads 12. For example, a layer of dielectric material (such as silicon dioxide or silicon nitride) can be formed on the backside of electronic component 15, or an insulating material such as tape can be placed along the bottom surface of electronic component 15. Alternatively, an insulating material (not shown) can be formed on leadframe 18 or leads 12.

Figure 4:
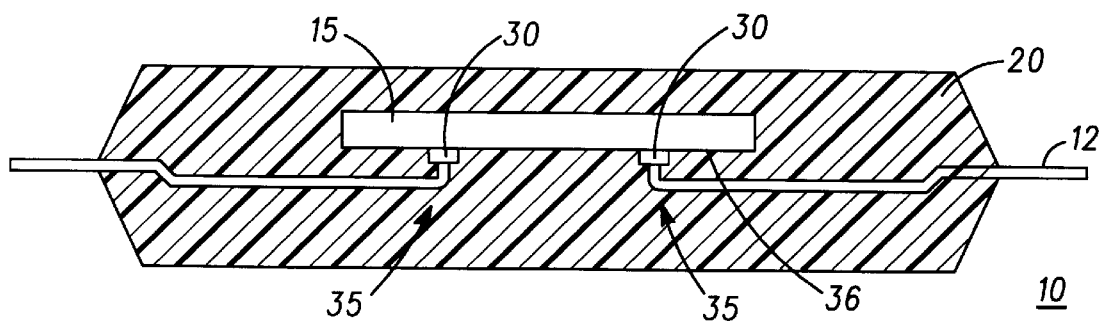

FIG. 4 is provided to illustrate an alternative method of bonding electronic component 15 to leads 12. For example, the present invention can be used in flip-chip or tape automated bonding (TAB) assembly processes. In such an application, the tips 35 of leads 12 are bent slightly so that they are the only portion of leads 12 to come into physical contact with bonding pads 30 of electronic component. It is perhaps also possible to form an insulating material (not shown) across the top surface 36 of electronic component 15 so that bonding pads 30 are the only electrically active portions exposed along the top surface 36. In such an application it would not be necessary to bend the tips 35 of leads 12 as the insulating layer would provide the necessary electrical isolation.

Figure 5:
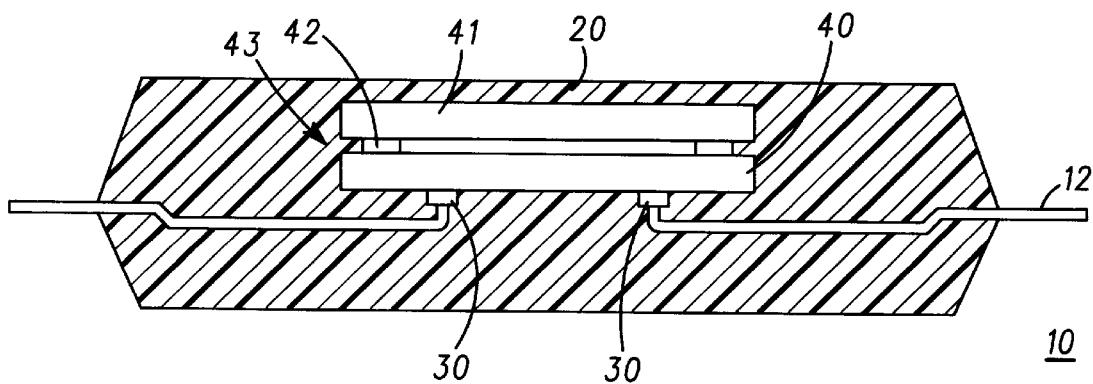

FIG. 5 is provided to illustrate how the teachings of the present invention could be used to mount a multi-chip module 43 to leads 12. Multi-chip module 43 comprises semiconductor devices 40–41 that are electrically connected to each other through bonding regions 42. It also possible to connect semiconductor devices 40–41 with a leadframe positioned between the two devices, or to place semiconductor device 40–41 side-by-side on a single leadframe. Thus, the present invention can be used to form an electronic component assembly that is made up of multiple discrete components, integrated circuits, etc., or a combination of the possible electronic components suggested earlier with reference to FIG. 1.

Figure 6:
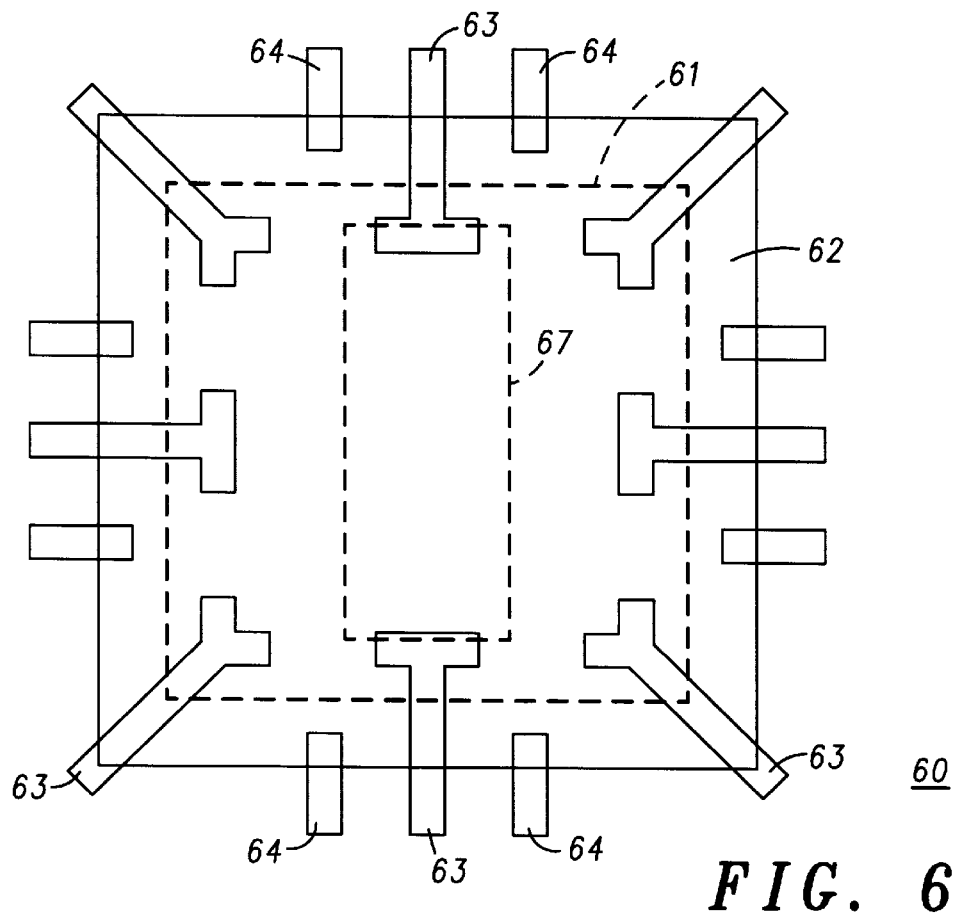
FIGS. 6–7 are top views of electronic component assemblies formed in accordance with alternative embodiments of the present invention.
Figure 7:
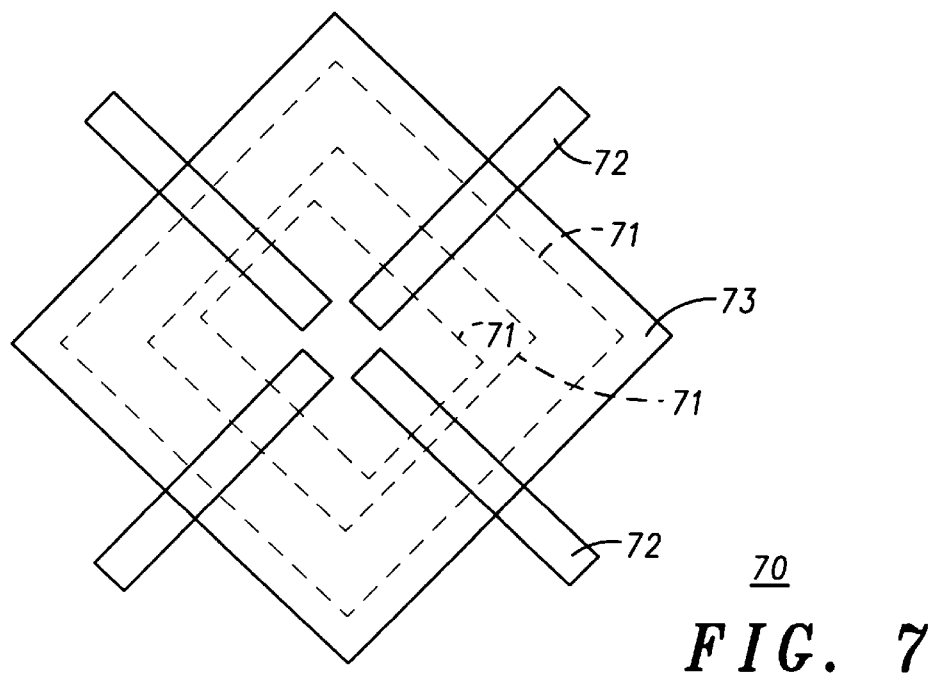

Referring now to FIGS. 6–7, alternative configurations for leadframes in accordance with the present invention are provided. As shown in FIG. 6, it is possible to configure the leads 63–64 of a leadframe so that only every other lead 63 comes in physical contact with an electronic component 61. Even though leads 64 do not necessarily come in contact with electronic component 61, they are electrically connected to electronic component 61 by bonding wires (not shown). Thus, the only limitation on the size of the electronic component that could be formed on the leadframe is the maximum length of the bonding wire that can be formed from leads 64 to electronic component 61. In addition, it is possible to use the same leadframe to form an electronic component assembly 60 where an electronic component 67 only comes in contact with two of leads 63 as shown with dashed lines in FIG. 6.

Electronic component assembly 60 also includes a package 62 that is used to hold leads 63–64 while electronic component assembly 60 is in operation.

FIG. 7 illustrates yet another alternative embodiment for forming an electronic component assembly 70 in accordance with the present invention. It is possible to configure the leads 72 of a leadframe in a "cross" pattern to provide support to an electronic component 71. In FIG. 7, various dashed lines are used to illustrate how the same leadframe can be used to assemble an electronic component 71 of various sizes. Again, a package 73 is used to hold and protect leads 72 and electronic component 71 while electronic component assembly 70 is in operation.

One of the advantages of the present invention is that the same leadframe can be used to form electronic component assemblies that contain electronic components of different sizes. Thus, the present invention obviates the need to form a leadframe with a customized die flag for each possible electronic component that might be assembled in a high volume manufacturing operation. This not only reduces the cost associated with the die flag, but also simplifies the assembly process by allowing the same leadframe to have multiple uses.

What is claimed is:

1. An electronic component assembly comprising:
   a leadframe having a first lead, a second lead, and a third lead that are electrically isolated from each other;
   an electronic component mounted to the leadframe so that at least a portion of the electronic component is in physical contact with the first lead, the second lead, and the third lead, wherein the electronic component is electrically coupled to the first lead, the second lead, and the third lead wherein such physical contact provides support for said electronic component thereby abating the need for a die flag; and
   a package encapsulating at least a portion of the electronic component, wherein the first lead, the second lead, and the third lead extend from the package.

2. The electronic component assembly of claim 1 wherein the leadframe is devoid of a die flag.

3. The electronic component assembly of claim 2 wherein the leadframe is devoid of a tie bar.

4. The electronic component assembly of claim 1 wherein any portion of the leadframe that is in physical contact with the electronic component is also electrically coupled to the electronic component.

5. The electronic component assembly of claim 1 wherein the first lead provides a first power supply voltage to the electronic component, the second lead provides a second power supply voltage to the electronic component, and the third lead provides a data signal to the electronic component.

6. The electronic component assembly of claim 1 wherein the electronic component is a discrete component, a microprocessor, a microcontroller, or a memory device.

7. The electronic component assembly of claim 1 wherein the leadframe comprises sixteen leads that are each in physical contact with the electronic component and electrically coupled to the electronic component.

8. An electronic component assembly comprising:
   a leadframe having a plurality of leads; and
   an electronic component mounted to the plurality of leads so that every portion of the leadframe that is in physical contact with the electronic component is also electrically coupled to the electronic component wherein such physical contact between said leadframe and said electronic component provides support for said electronic component thereby abating the need for a die flag.

9. The electronic component assembly of claim 8 further comprising a package encapsulating at least a portion of the electronic component and at least a portion of the plurality of leads, wherein the plurality of leads extend from the package.

10. The electronic component assembly of claim 8 wherein the plurality of leads includes at least three leads that are electrically isolated from each other.

11. The electronic component assembly of claim 10 wherein each of the at least three leads provides a different data signal to the electronic component.

12. The electronic component assembly of claim 8 wherein the leadframe is devoid of a die flag and a tie bar.

13. The electronic component assembly of claim 8 wherein the plurality of leads is the only portion of the leadframe that is in physical contact with the electronic component.

14. An electronic component assembly comprising:
   a leadframe having a plurality of leads; and
   an electronic component mounted to the leadframe, wherein every portion of the plurality of leads that is in physical contact with the electronic component is also electrically coupled to the electronic component wherein such physical contact provides support for said electronic component thereby abating the need for a die flag.

15. The electronic component assembly of claim 14 wherein the plurality of leads is the only portion of the leadframe that is in physical contact with the electronic component.

* * * * *